(12) United States Patent
Braun et al.

(10) Patent No.: US 7,088,612 B2
(45) Date of Patent: Aug. 8, 2006

(54) MRAM WITH VERTICAL STORAGE ELEMENT IN TWO LAYER-ARRANGEMENT AND FIELD SENSOR

(75) Inventors: Daniel Braun, Paris (FR); Peter Beer, Fontainebleau (FR); Rainer Leuschner, Samoreau (FR); Ulrich Klostermann, Fontainebleau (FR)

(73) Assignee: Infineon Technologies AG, Munich (DE)

( * ) Notice: Subject to any disclaimer, the term of this patent is extended or adjusted under 35 U.S.C. 154(b) by 146 days.

(21) Appl. No.: 10/923,639

(22) Filed: Aug. 20, 2004

(65) Prior Publication Data

US 2006/0039186 A1    Feb. 23, 2006

(51) Int. Cl.
*G11C 11/15*    (2006.01)

(52) U.S. Cl. .................. 365/173; 365/158; 365/171
(58) Field of Classification Search ............. 365/173, 365/171, 158
See application file for complete search history.

(56) References Cited

U.S. PATENT DOCUMENTS

| 6,545,906 B1 | 4/2003 | Savtchenko et al. |
| 6,940,749 B1* | 9/2005 | Tsang .................. 365/171 |
| 2005/0205952 A1* | 9/2005 | Park et al. ............. 257/421 |

* cited by examiner

*Primary Examiner*—Tuan T. Nguyen
*Assistant Examiner*—Pho M. Luu
(74) *Attorney, Agent, or Firm*—Dicke, Billig & Czaja, PLLC

(57) ABSTRACT

A magnetic memory element including a magnetic storage element including two magnetic layers made of magnetic material, said two magnetic layers opposing each other in a parallel relationship and being vertically oriented relative to a wafer surface on which the magnetic memory element is formed, said two magnetic layers further having a magnetic anisotropy, while its magnetization vectors are magnetically coupled to at least one current line, wherein said two magnetic layers are arranged on a same side of said at least one current line, and a magnetic sensor element including at least one magnetic layer having a magnetization vector being magnetically coupled to said magnetization vectors of said two magnetic layers of said magnetic storage element, said magnetic sensor element being electrically coupled to said at least one current line.

27 Claims, 2 Drawing Sheets

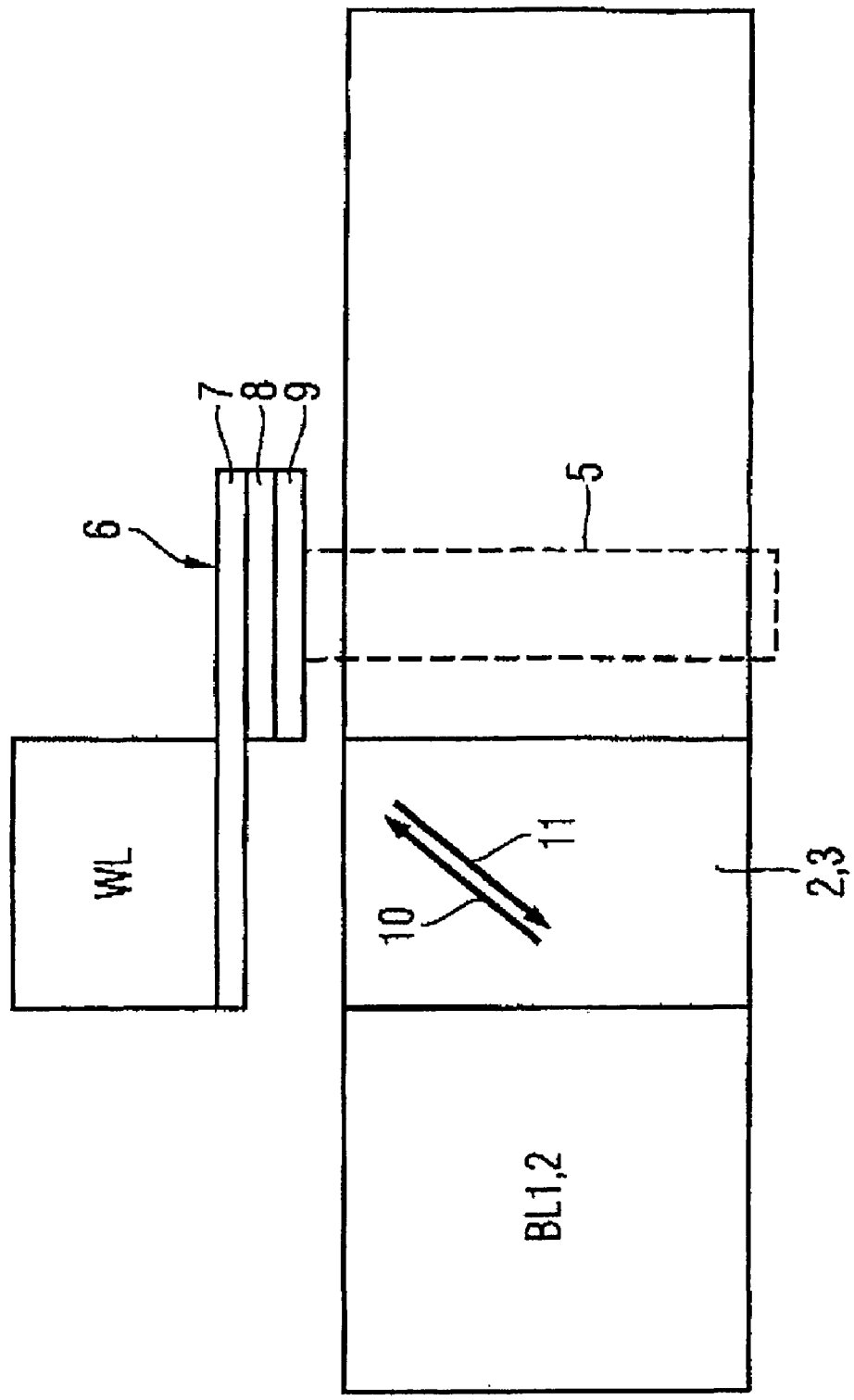

MRAM WITH VERTICAL STORAGE ELEMENT IN TWO LAYER-ARRANGEMENT AND FIELD SENSOR

CROSS-REFERENCE TO RELATED APPLICATIONS

This Patent Application is also related to Utility patent application Ser. No. 10/923,651, filed on Aug. 20, 2004, entitled "MRAM With Vertical Storage Element in Two Layer-Arrangement and Field Sensor," having Docket No. I433.121.101; Utility patent application Ser. No. 10/922,434, filed on Aug. 20, 2004, entitled "MRAM With Vertical Storage Element and Field Sensor," having Docket No. I433.122.101; Utility patent application Ser. No. 10/923639, filed on Aug. 20, 2004, entitled "MRAM With Magnetic Via For Storage of Information and Field Sensor," having Docket No. I433.123.101; and is commonly assigned to the same assignee as the present invention, and which is herein incorporated by reference.

FIELD OF THE INVENTION

This invention relates to non-volatile semiconductor memory devices, and more particularly, relates to magnetic memory elements and a magnetic random access memory (MRAM) device comprising said memory elements for use in a semiconductor integrated circuit.

BACKGROUND

Magnetic (or magneto-resistive) random access memory (MRAM) is a non-volatile access memory technology that could potentially replace the dynamic random access memory (DRAM) as the standard memory for computing devices. Particularly, the use of MRAM-devices as a non-volatile RAM will eventually allow for "instant on"-systems that come to life as soon as the computer system is turned on, thus saving the amount of time needed for a conventional computer to transfer boot data from a hard disk drive to volatile DRAM during system power up.

A magnetic memory element (also referred to as a tunneling magneto-resistive or TMR-device) includes a structure having ferromagnetic layers separated by a non-magnetic layer (barrier) and arranged into a magnetic tunnel junction (MTJ). Digital information is stored and represented in the magnetic memory element as directions of magnetization vectors in the ferromagnetic layers. More specifically, the magnetic moment of one ferromagnetic layer is magnetically fixed or pinned (also referred to as a "reference layer"), while the magnetic moment of the other ferromagnetic layer (also referred to as "free layer") is free to be switched between the same and opposite directions with respect to the fixed magnetization direction of the reference layer. The orientations of the magnetic moment of the free layer are also known as "parallel" and "anti-parallel" states, respectively, wherein a parallel state refers to the same magnetic alignment of the free and reference layers, while an anti-parallel state refers to opposing magnetic alignments therebetween.

Depending upon the magnetic states of the free layer (i.e. parallel or anti-parallel states), the magnetic memory element exhibits two different resistance values in response to a voltage applied across the magnetic tunnel junction barrier. The particular resistance of the TMR-device thus reflects the magnetization state of the free layer, wherein its resistance is "low" when the magnetization is parallel, and "high" when the magnetization is anti-parallel. Accordingly, a detection of changes in resistance allows a MRAM-device to provide information stored in the magnetic memory element, that is to say to read information from the magnetic memory element. In addition, a magnetic memory element is written to through the application of a bi-directional current in a particular direction, in order to magnetically align the free layer in a parallel or anti-parallel state.

An MRAM-device integrates a plurality of magnetic memory elements and other circuits, such as a control circuit for magnetic memory elements, comparators for detecting states in a magnetic memory element, input/output circuits and miscellaneous support circuitry. As such, there are certain microfabrication processing difficulties to be overcome before high capacity/density MRAM-devices become commercially available. For example, in order to reduce the power consumption of the MRAM-device and provide a variety of support functions CMOS-technology is used. Various CMOS processing steps are carried out at relatively high temperatures, while ferromagnetic materials employed in the fabrication of MRAM-devices require substantially lower process temperatures. Thus, the magnetic memory elements are designed to be integrated into the back end wiring structure of back-end-of-line (BEOL) CMOS processing following front-end-of-line (FEOL) CMOS processing.

To be useful in present day electronic devices, very high density arrays of magnetic memory cells are utilized in magnetic random access memories. In these high density arrays the magnetic cells are generally arranged in rows and columns, with individual cells being addressable for reading and writing operations by the selection of an appropriate row and column containing the desired cell. Also, conveniently, orthogonal current lines are provided, one for each row and one for each column so that a selected cell is written by applying current to the appropriate row current line and the appropriate column current line.

Recently, and especially in view of portable equipment, such as portable computers, digital still cameras and the like, the demand of low-cost and particularly high-density mass storage memories has increased dramatically. Therefore, one of the most important issues for low-cost and high-density MRAM-devices is a reduction of the MRAM-cell size. However, down-scaling MRAM-cells requires smaller and smaller magnetic tunnel junctions and, therefore, a lot of severe problems arise, since for a given aspect ratio and free layer thickness the activation energy, being dependent on the free layer volume, scales down like w, where w is the width of the magnetic cell. Otherwise, the switching fields increase roughly like 1/w. Thus, in scaling down a MRAM-cell field selected switching becomes ever harder, but at the same time the magnetic cell loses its information more and more rapidly due to thermal activation.

In light of the above, there is a need for the invention to provide a magnetic memory element and magnetic random access memory (MRAM) device comprising such magnetic memory elements enabling a cell-size down-scale without thereby causing severe problems as to an increase of switching-fields and decrease of activation energy.

SUMMARY

The present invention relates to a magnetic memory element comprising a magnetic storage element comprised of two magnetic layers made of magnetic material, said two magnetic layers opposing each other in a parallel relationship and being vertically oriented relative to a wafer surface on which the magnetic memory element is formed, said two magnetic layers further having a magnetic anisotropy, while its magnetization vectors are magnetically coupled to at least one current line, wherein said two magnetic layers are arranged on a same side of said at least one current line, and a magnetic sensor element comprising at least one magnetic layer having a magnetization vector being magnetically coupled to said magnetization vectors of said two magnetic layers of said magnetic storage element, said magnetic sensor element being electrically coupled to said at least one current line.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2 is a schematic diagram of a vertical cross-sectional view sectioned along a bit line of the embodiment of the magnetic memory element of FIG. 1.

DETAILED DESCRIPTION

Figure 1:
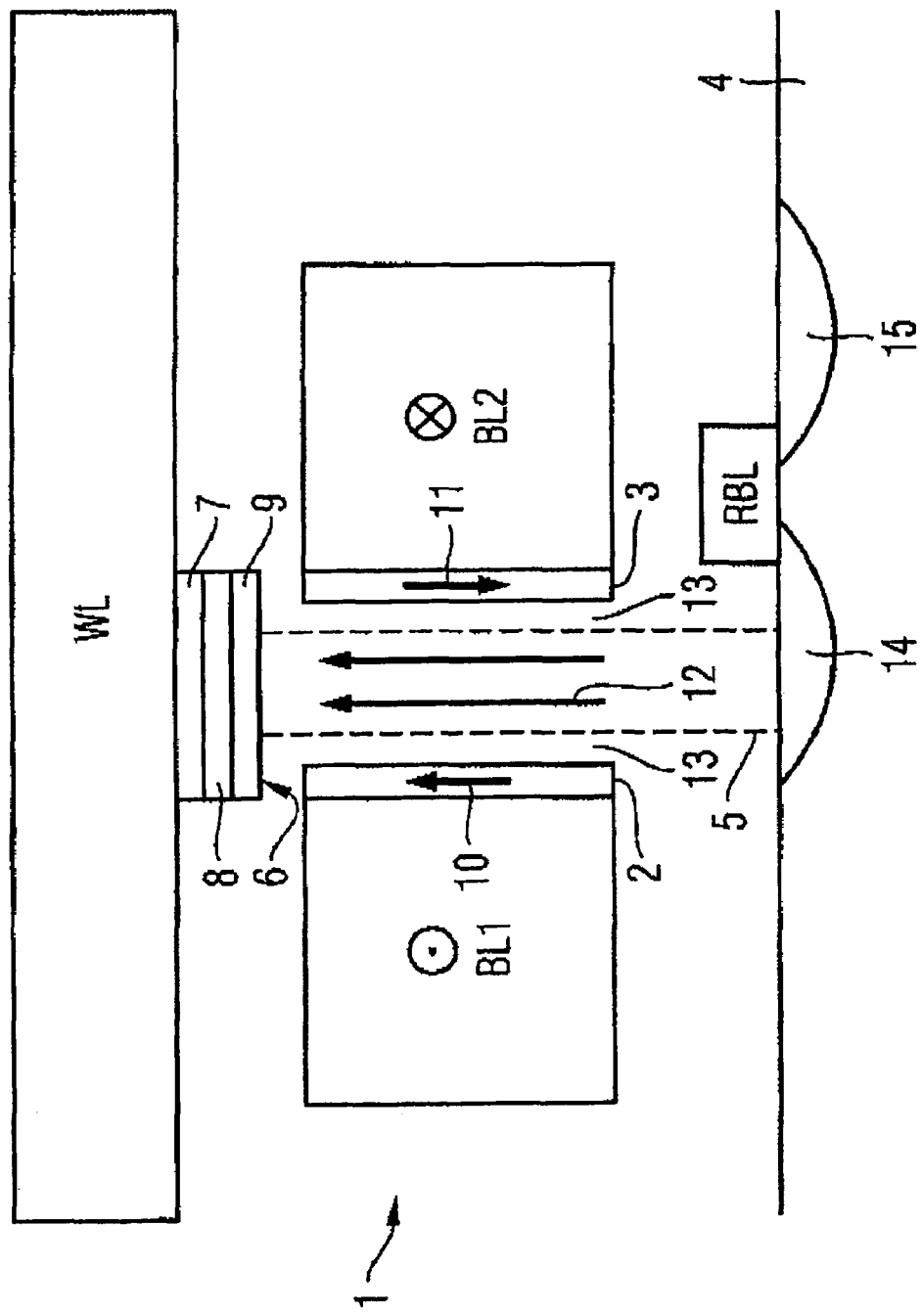
FIG. 1 is a schematic diagram of a vertical cross-sectional view sectioned along a word line illustrating one embodiment of the magnetic memory element of the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIGS. 1 and 2 illustrate one embodiment of a magnetic memory element according to the invention, generally at 1. Now referring to FIGS. 1 and 2, which are schematic, vertically cut, cross-sectional views sectioned along word line (WL) and bit line (BL), respectively, one embodiment of the magnetic memory element of the invention is explained. The magnetic memory element 1 comprises a magnetic storage element consisting of two magnetic layers 2 and 3, which are made up of a ferromagnetic material, which may be conductive or not. Each one of the magnetic layers 2, 3 is positioned in contact to its adjacent part of a two-part split bit line BL1 and BL2, respectively. Both magnetic layers 2, 3 are opposed to each other in a parallel relationship and arranged in a vertical orientation relative to the surface of a wafer 4 on which the magnetic memory element is formed. In perspective view of FIG. 1 between both magnetic layers an electrically conductive via 5 is formed for providing a straight electrical contact between a magnetic tunneling junction (MTJ) 6 for use as magnetic sensor element for sensing magnetic stray fields of magnetic layers 2, 3 and a FET-transistor for use as selection device, comprising drain 14 and source 15. The MTJ 6 is in direct electrical contact with a word line WL. In order to electrically isolate via 5 from magnetic layers 2, 3, via 5 is embedded in isolated material 13.

As illustrated in FIG. 2, both magnetic layers 2, 3 are provided with intrinsic magnetic anisotropy, which is directed under an acute angle of approximately 45° relative to the wafer 4 surface, while its magnetization vectors 10, 11 form a substantially magnetic flux closed pair, i.e., magnetization vectors 10, 11 are in anti-parallel alignment. As a result, magnetization vectors 10, 11 of both magnetic layers 2, 3 may be switched between the two directions under an acute angle of approximately 45° relative to the wafer 4 surface in response to external magnetic fields coupled therewith. The magnetic layers 2, 3, more precisely its magnetization vectors 10, 11 are magnetically coupled to the magnetic field of the WL and to the magnetic fields the two-part split bit line BL1 and BL2, respectively. Through BL1 and BL2 two opposing currents are sent, particularly a current out of the plane of FIG. 1 for BL1 and a current into the plane of FIG. 2 for BL2. BL1 and BL2 thus create a magnetic field 12 in the planes of the magnetic layers 2, 3 of the magnetic storage element, which points in the same direction, while the WL creates a magnetic field (not shown in the figures) perpendicular to the planes of the magnetic layers 2, 3 of the magnetic storage element. For switching both magnetization vectors 10, 11 typically the Stoner-Wohlfahrt switching scenario may be used with the WL on top of the magnetic layers 2, 3 that creates the hard axis field, which switching scenario, however, is well-known to those skilled in the art and therefore need not be explained in further details here.

The MTJ 6 for sensing information stored in the magnetic storage element is horizontally aligned relative to the wafer 4 surface, and further, is conductively interposed between WL and drain 14 of FET-transistor by way of electrically conductive via 5. Via 5 may for example be made of TaN. For sensing information of the magnetic storage element, MTJ 6 is magnetically coupled to the magnetic layers 2, 3 of the magnetic storage element. The MTJ 6, which has an aspect ratio of about 1, comprises two ferromagnetic layers 7 and 9 of magnetic material stacked in parallel, overlying relationship and are separated by a layer of nonmagnetic material 8. The ferromagnetic layer 9 is designed to be a reference layer, the magnetic moment of which being pinned, while the ferromagnetic layer 7 is designed to be a free layer, the magnetic moment of which being free to be switched between the same and opposite directions with respect to the pinned magnetization direction of the reference layer. The orientation of the magnetic moment of the free layer may be switched between its parallel and anti-parallel states, in response to the magnetic stray field of the magnetic layers 2, 3 of the magnetic storage element, which is seen by the MTJ.

Since the MTJ exhibits two different resistance values in response to a voltage applied across the MTJ-barrier, information stored in the magnetic storage element may be read out by a sense current, which flows between WL and FET-transistor drain 7. For reading out parallel and anti-parallel states of the MTJ, a read bit line (RBL) is provided.

As illustrated in FIG. 2, to ensure a high magnetic coupling between WL and magnetic layers 2, 3, free layer 7 of MTJ 6 is extended in horizontal direction to allow for a horizontal shift of the WL so that the latter one is positioned vertically above magnetic layers 2, 3. Otherwise, to ensure a high magnetic coupling between MTJ 6 and magnetic layers 2, 3, (level of magnetic stray fields) the MTJ 6 is approximately positioned in the vanishing line (alignment) of the 45° declined magnetization vectors 10, 11 of magnetic layers 2, 3.

According to one embodiment of the invention, magnetic memory element 1, comprises a magnetic storage element and a magnetic sensor element, which may be provided in spatial distance from the magnetic storage element or be in contact therewith, and at least one current line, typically a number of three, which may be identified by a bit line, a write word line and read word line, respectively. As in the convenient case of MRAM-cells, the magnetic memory element 1 of the present invention is formed on a wafer surface.

The magnetic storage element of the magnetic memory element 1 of the invention comprises two magnetic layers 2, 3, which are made of a (ferro-) magnetic material, such as Ni, Fe, Co and their alloys, and are vertically oriented relative to the wafer surface on which the magnetic memory element is formed. The magnetic layers of the magnetic storage element are provided with magnetic anisotropy, which may be realized by appropriately choosing their aspect ratios and/or by intrinsic anisotropy, as is well-known to those skilled in the art. Particularly, the height of the magnetic layers 2, 3 of the magnetic storage element may be chosen to be slightly larger than its width so as to give the magnetic layers a finite aspect ratio in vertical direction and thus shape anisotropy with a preferred direction perpendicular to the wafer surface. Intrinsic magnetic anisotropy may be combined with magnetic shape anisotropy. Both magnetic layers 2, 3 of the magnetic storage element 1 are arranged on the same side of the at least one current line, such that they see a magnetic field from the at least one current line in the same direction.

In one embodiment of the present invention, the magnetization vectors of the magnetic layers 2, 3 of the magnetic storage element are magnetically coupled to the at least one current line, and, in a typical and preferable arrangement of the invention, are magnetically coupled to two current lines, which may be identified by the bit line and the (write) word line, respectively. The magnetic anisotropy of the magnetic layers 2, 3 of the magnetic storage element may preferably be oriented substantially perpendicular relative to the wafer surface, in case Stoner-Wohlfahrt switching is to be effected. Otherwise, it may be preferred, that the magnetic anisotropy of each of said magnetic layers of said magnetic storage element has an acute angle of approximately 45° relative to said wafer surface, in case adiabatic rotational switching (see for example U.S. Pat. No. 6,545,906 to Savtchenko et al., incorporated herein by reference) is to be used. In both cases, as well as any other case of an orientation of the magnetic anisotropy different from 45° or 90° relative to the wafer surface, the magnetic anisotropy of the magnetic layers 2, 3 of the magnetic storage element can be defined by using intrinsic anisotropy alone or together with shape anisotropy. Particularly, the magnetic layers 2, 3 may have an aspect ratio of about 1, in which case the intrinsic anisotropy can be directed under approximately 45° or 90° relative to the wafer surface, or larger or smaller than 1, in which case the direction and strength of the intrinsic anisotropy has to be adjusted accordingly to obtain a direction of approximately 45° or 90° relative to the wafer surface.

For magnetically coupling the magnetization vector of both magnetic layers 2, 3 of the magnetic storage element to the magnetic field of the at least one current line, the former are preferably positioned adjacent or at least close to said at least one current line. It especially may be advantageous if said magnetic storage element is positioned to be in contact with said at least one current line.

Digital information stored in the magnetic storage element is read out by the magnetic sensor element that senses the magnetization of the two magnetic layers of the magnetic storage element. To this aim, the magnetic sensor element of the magnetic memory element 2 of the invention comprises at least one magnetic layer, made of a magnetic material, the magnetization vector of which being magnetically coupled to the magnetization vectors of both magnetic layers of the magnetic storage element. Magnetic coupling between both magnetic layers of the magnetic storage element and the magnetic sensor element may be realized via a magnetic stray field of the magnetic storage element seen by the magnetic sensor element. In that case, in order to provide for sufficient magnetic coupling between magnetic storage and magnetic sensor elements, the magnetic sensor element has to be positioned within the magnetic stray field of the magnetic storage element, such that the magnetization vector of the magnetic layer of the magnetic sensor element may be sufficiently influenced, and particularly is able to follow the magnetization vectors of the magnetic storage element. To this aim, the magnetic sensor element typically is placed in the vicinity of the magnetic storage element. Alternatively, magnetic coupling between the magnetic layers of the magnetic storage element and the magnetic sensor element may also be realized via magnetic exchange coupling, in which case the magnetic storage element and the magnetic sensor element are brought into contact.

The magnetic sensor element of the magnetic memory element 1 of the invention is conductively connected to the at least one current line. Particularly, it may be conductively connected to an active structure, that is to say a selection device of the wafer, like a FET-transistor, diode and the like. Alternatively, in realizing a typical "cross-point-architecture", it may also be conductively connected to two current lines, wherein the first one of which may typically be identified as bit line, while the other one may typically be identified as word line.

The magnetic sensor element of the invention can have an arbitrarily chosen shape, for instance circle, round, square with rounded edges and the like. The magnetic sensor element preferably is realized as a magnetic tunnel junction, which comprises two magnetic layers made of magnetic material stacked in parallel, overlying relationship and are separated by a layer of nonmagnetic material.

In one preferred embodiment of the invention, the magnetic memory element 1 comprises a first current line, which may be identified by a word line (WL), and a two-part split second current line, which may be identified by bit lines (BL1, BL2), while both magnetic layers of the magnetic storage element are arranged in between the two-part split second current line. They may be isolated from each other by a non-conductive, electrically isolating material.

Arranging the two magnetic layers 2, 3 of the magnetic storage element, it is preferable if one of the magnetic layers is positioned adjacent or close to one part of said two-part split second current line, while the other one of the magnetic layers is positioned adjacent or close to the other part of said two-part split second current line. Alternatively, it is also preferable, if one of the magnetic layers is positioned to be in contact with one part of said two-part split second current line, while the other one of the magnetic layers is positioned to be in contact with the other part of said two-part split second current line.

Providing for two magnetic layers 2, 3 being opposite to each other in a parallel relationship offers the advantage to allow for a substantially magnetic flux closed pair. In the latter case, the magnetization vectors of the magnetic layers of the magnetic storage element constituting a magnetic flux closed pair are in anti-parallel alignment.

In one embodiment of the present invention an aspect ratio of the magnetic layers of the magnetic storage element preferably is chosen to be larger than 1, and may particularly be in the range of from 1.5 to 3 in order to provide for a sufficiently high magnetic shape anisotropy.

In general, in order to provide for a sufficiently precise sensing of the magnetization of the magnetic storage element, the magnetic anisotropy of the magnetic layer of the magnetic sensor element is chosen to be smaller than that one of the magnetic layers 2, 3 of the magnetic storage element. While, basically, shape anisotropy may be combined with intrinsic anisotropy, i.e. shape anisotropy may be (partially) compensated or added by intrinsic anisotropy, it is clear that it is the resulting total magnetic anisotropy that has to be chosen to be smaller than that one of the magnetic storage element. To this aim, it may be preferable to choose an aspect ratio of each of the magnetic layers of the magnetic sensor element, which is in the range of from 1 to 2, and more preferably amounts to approximately 1.

Scaling down the magnetic memory element 1 of the present invention, such memory element may be realized in approximately 8 $F^2$ structure size, wherein F is the minimum lithographic feature size, which at present using (UV) photolithographic methods amounts to about 90 nm. Otherwise, independently from the size of the magnetic memory element as such, the magnetic sensor element may preferably be realized in about 1 $F^2$ structure size.

According to another embodiment of the invention, it concerns a magnetic random access memory device, which comprises a plurality of magnetic memory elements 1 as above described.

Here, and in accordance with its typical usage, the term "aspect ratio" denotes a ratio of orthogonal dimensions which span the magnetization vector's plane, which in a vertically oriented plane may be identified by a ratio of its height to its width, and, in a horizontally oriented plane may be identified by a ratio of its length to its width. Needless to say, here, and in accordance with its typical usage, the term "vertical" relates to the plane of the wafer surface and thus denotes a direction perpendicularly oriented to the wafer surface, while the term "horizontal" denotes a direction parallel oriented to the wafer surface.

With the above magnetic memory element 1, and in contrast to conventional MRAM-cells where magnetic storage element and magnetic field sensor are both incorporated in the free layer of one and the same magnetic tunneling junction, it is possible to store information in the magnetic polarization of the magnetic storage element, while the readout is done in a separate magnetic sensor element, for example a magnetic tunneling junction, which may be spatially distanced from the magnetic storage element or be in contact therewith. Since the magnetic sensor element, which just serves as field sensor, is separated from the magnetic storage element, it can be realized arbitrarily small. Contrary to the magnetic storage element being vertically oriented, the magnetic sensor element can be horizontally oriented and, thus, can be produced with conventional thin layer deposition and patterning technology.

The horizontal magnetic sensor element can be made very small and have an aspect ratio of about 1. It, however, should have a lower magnetic anisotropy than the magnetic storage element to follow the magnetic field arising from the vertical magnetic storage element. Otherwise, the aspect ratio and thus the switching field (in the case that shape anisotropy is used) of the vertically aligned magnetic storage element can be controlled by the depth of the trench to be etched for its realization.

Thus, the actual magnetic storage element can be made rather large, in particular with a large enough volume to prevent thermally activated switching. As for the magnetic sensor element for sensing the magnetic stray field of the magnetic storage element, its activation energy is given by the Zeeman energy difference 2 $HM_S$ V, where H is the magnetic stray field from the magnetic storage element seen by the magnetic sensor element, $M_S$ is its saturation magnetization, and V the volume of its free layer. In general, the whole structure of the magnetic storage element, which may be comprised of two magnetic layers, and the magnetic sensor element can be optimized as a whole in terms of switching fields and activation energy to the lowest lying erroneous state.

The interaction between magnetic storage elements is strongly reduced as first of all the magnetic field points mostly perpendicular to the wafer surface, provided that the magnetic anisotropy is perpendicularly oriented to the wafer surface, and may also be very well flux-closed. As for the magnetic sensor elements, their magnetic moments and thus interaction is very small as they may be realized to have only a small total magnetic moment, due to an aspect ratio near 1.

It shall be emphasized, that the vertical magnetic storage element can be made substantially wider than 1 F without increasing the magnetic memory element size, independent of the size of the actual planar, horizontal magnetic memory element which can be kept at 1 $F^2$. Thus, for example, in a F=90 nm lithography technology and FET-architecture, the magnetic sensor element can be made easily 180 nm wide or more (and e.g., 360 nm deep, 5 nm thick, i.e. about the size of a nowadays 180 nm technology cell), as the unit memory cell has at best 4 F in the long direction (assuming DRAM technology transistors with basically no contact overhead). Thus, there is still a space of 2 F=180 nm between neighbouring magnetic memory elements on the same bit line.

Furthermore, the spacing of the magnetic storage elements is less critical than for planar elements, as they do not interact unless written (the magnetization vector is perpendicular to the wafer plane). In the case of drain contact sharing, the length of the memory unit cell possibly shrinks to 3 F (again assuming zero overhead for contacts), and so a 2 F vertical magnetic storage element has still 1 F spacing.

The two vertical magnetic layers of the magnetic storage element in contact with the two-part split second current line can be produced in the following way:

Forming of a trench for one of the two-part split second current line; depositing of a liner material; removing of bottom material of liner material in the trench, for example by reactive ion etching (RIE) or milling out, so that side walls in the trench are left; using of ion milling under an appropriate angle to remove one of the side walls; filling of the trench with isolator, followed by chemical-mechanical polishing and thus ending up with the one of (isolator filled) two-part split second current line with a vertical magnetic layer on the one side; etching of a second trench for the other one of the two-part split second current line (with the filled one part of the second current line protected by photo resist);

depositing of liner material; removing of bottom material of liner material in the trench, for example by reactive ion etching (RIE) or milling out, so that side walls in the trench are left; using of ion milling under a complementary angle to remove the other one of the side walls; following the patterning in second current line direction; filling of the trench with insulator (this material needs to have good etch selectivity with respect the interlayer dielectric and the liner material); chemical-mechanical polishing; lithography for patterning in second current line direction to make discrete elements out of the long side walls; removal of insulator and liner where not desired, for example by RIE; removal of resist; removal of insulator in trenches for example by RIE leaving the magnetic layers; filling of trenches with conductive material, such as Cu.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A magnetic memory comprising:
   a magnetic storage element including two opposing magnetic layers, the opposing magnetic layers being vertically oriented relative to a wafer surface; and
   a magnetic sensor element including at least one sensor magnetic layer, where the sensor magnetic layer is magnetically coupled to the two opposing magnetic layers.

2. The magnetic memory of claim 1, comprising:
   a current line, where the magnetic sensor element is coupled to the current line.

3. The magnetic memory of claim 1, comprising:
   wherein the opposing magnetic layers have magnetic vectors magnetically coupled to at least one current line.

4. The magnetic memory of claim 3, where the opposing magnetic layers are arranged on the same side of the at least one current line.

5. The magnetic memory of claim 1, wherein the magnetic sensor element is arranged to be spatially distanced from the magnetic storage element.

6. A magnetic memory element comprising:
   a magnetic storage element including two magnetic layers made of magnetic material, the two magnetic layers opposing each other in a parallel relationship and being vertically oriented relative to a wafer surface on which the magnetic memory element is formed, said two magnetic layers further having a magnetic anisotropy, while its magnetization vectors are magnetically coupled to at least one current line, wherein the two magnetic layers are arranged on a same side of the at least one current line;
   a magnetic sensor element comprising at least one magnetic layer having a magnetization vector being magnetically coupled to said magnetization vectors of said two magnetic layers of said magnetic storage element, said magnetic sensor element being electrically coupled to said at least one current line.

7. The magnetic memory element of claim 6, wherein the magnetic sensor element is arranged to be spatially distanced from said magnetic storage element.

8. The magnetic memory element of claims 6, wherein said magnetic sensor element is conductively coupled to a selection device.

9. The magnetic memory element of claims 6, wherein said magnetic sensor element is conductively coupled to two current lines, one of which being a bit line and the other one being a word line.

10. A magnetic memory element comprising:
    a first current line and a two-part split second current line;
    a magnetic storage element including two magnetic layers made of magnetic material, the two magnetic layers opposing each other in a parallel relationship and being vertically oriented relative to a wafer surface on which the magnetic memory element is formed, said two magnetic layers further having a magnetic anisotropy, while its magnetization vectors are magnetically coupled to at least one current line, wherein the two magnetic layers are arranged on a same side of the at least one current line, and the two magnetic layers are arranged in between the two-part split second current line; and
    a magnetic sensor element comprising at least one magnetic layer having a magnetization vector being magnetically coupled to said magnetization vectors of said two magnetic layers of said magnetic storage element..

11. The magnetic memory element of claim 10, wherein one of the magnetic layers of the magnetic storage element is positioned adjacent to one part of the two-part split second current line, while the other one of the magnetic layers of the magnetic storage element is positioned adjacent to the other part of the two-part split second current line.

12. The magnetic memory element of claim 10, wherein one of the magnetic layers of the magnetic storage element is positioned to be in contact with one part of the two-part split second current line, while the other one of the magnetic layers of the magnetic storage element is positioned to be in contact with the other part of the two-part split second current line.

13. A magnetic memory element comprising:
    a magnetic storage element including two magnetic layers opposing each other in a parallel relationship and being vertically oriented relative to a wafer surface, the two magnetic layers having a magnetic anisotropy, while its magnetization vectors are magnetically coupled to at least one current line, wherein the two magnetic layers are arranged on a same side of the at least one current line; and
    a magnetic sensor element comprising at least one magnetic layer having a magnetization vector being magnetically coupled to the magnetization vectors of the two magnetic layers, the magnetic sensor element being electrically coupled to the at least one current line.

14. The magnetic memory element according to claim 13, wherein the magnetic anisotropy of each of the magnetic layers of the magnetic storage element has an acute angle of approximately 45° relative to the wafer surface.

15. The magnetic memory element of claim 13, wherein said magnetic anisotropy of each of said magnetic layers of said magnetic storage element is approximately perpendicular to said wafer surface.

16. The magnetic memory element of claim 13, wherein the magnetization vectors of the two magnetic layers of the magnetic storage element form a substantially magnetic flux closed pair.

17. The magnetic memory element of claim 13, wherein the magnetic layer of the magnetic sensor element is substantially parallel relative to the wafer surface.

18. The magnetic memory element of claim 13, wherein the magnetic sensor element is a magnetic tunnel junction comprising two magnetic layers of magnetic material stacked in parallel, overlying relationship and separated by a layer of nonmagnetic material.

19. The magnetic memory element of claim 13, wherein the magnetic sensor element has a straight vertical electrical contact to the selection device.

20. The magnetic memory element of claim 13, wherein an aspect ratio of the magnetic layer of the magnetic sensor element is in the range of from 1 to 2.

21. The magnetic memory element of claim 13, wherein an aspect ratio of the magnetic layer of the magnetic sensor element is approximately 1.

22. The magnetic memory element of claim 16, wherein said magnetic memory element is realized in about 8 $F^2$ structure size.

23. The magnetic memory cell of claim 13, wherein the magnetic sensor element is realized in about 1 $F^2$ structure size.

24. A magnetic random access memory device comprising:
   a plurality of magnetic memory elements, where one or more of the magnetic memory elements comprises:
   a magnetic storage element including two magnetic layers opposing each other in a parallel relationship and being vertically oriented relative to a wafer surface, the two magnetic layers having a magnetic anisotropy, while its magnetization vectors are magnetically coupled to at least one current line, wherein the two magnetic layers are arranged on a same side of the at least one current line; and
   a magnetic sensor element comprising at least one magnetic layer having a magnetization vector being magnetically coupled to the magnetization vectors of the two magnetic layers, the magnetic sensor element being electrically coupled to the at least one current line.

25. A magnetic random access memory comprising:
   a magnetic memory element comprising a first current line and a two-part split second current line, a magnetic storage element including two opposing magnetic layers in a parallel relationship and being vertically oriented relative to a wafer surface, the two magnetic layers having a magnetic anisotropy, while its magnetization vectors are magnetically coupled to at least one current line, the two magnetic layers are arranged on a same side of the at least one current line, and the two magnetic layers are arranged in between the two-part split second current line, and a magnetic sensor element comprising at least one magnetic layer having a magnetization vector being magnetically coupled to the magnetization vectors of the two magnetic layers of the magnetic storage element.

26. The memory of claim 25, wherein one of the magnetic layers of the magnetic storage element is positioned adjacent to one part of the two-part split second current line, while the other one of the magnetic layers of the magnetic storage element is positioned adjacent to the other part of the two-part split second current line.

27. The magnetic memory element of claim 25, wherein one of the magnetic layers of the magnetic storage element is positioned to be in contact with one part of the two-part split second current line, while the other one of the magnetic layers of the magnetic storage element is positioned to be in contact with the other part of the two-part split second current line.

* * * * *